United States Patent
Fulford, Jr. et al.

(10) Patent No.: US 6,376,330 B1
(45) Date of Patent: *Apr. 23, 2002

(54) DIELECTRIC HAVING AN AIR GAP FORMED BETWEEN CLOSELY SPACED INTERCONNECT LINES

(75) Inventors: H. Jim Fulford, Jr.; Robert Dawson; Fred N. Hause; Basab Bandyopadhyay, all of Austin; Mark W. Michael, Cedar Park; William S. Brennan, Austin, all of TX (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/655,242

(22) Filed: Jun. 5, 1996

(51) Int. Cl.⁷ ............................................. H01L 21/76
(52) U.S. Cl. .................... 438/421; 438/422; 438/619
(58) Field of Search ................... 257/750, 758, 257/760, 773, 774, 734, 508; 438/634, 421, 422, 699, 624, 618, 622, 626, 619

(56) References Cited

U.S. PATENT DOCUMENTS

| | | | |
|---|---|---|---|
| 4,182,023 A | 1/1980 | Cohen et al. ................ 29/571 |
| 4,675,074 A | 6/1987 | Wada et al. ................ 156/647 |
| 4,681,655 A | 7/1987 | Potter | |
| 4,899,439 A | 2/1990 | Potter et al. ................ 29/846 |
| 4,920,639 A | 5/1990 | Yee .............................. 29/846 |
| 5,000,818 A | 3/1991 | Thomas et al. | |
| 5,001,079 A * | 3/1991 | Van Laarhoven et al. | |
| 5,117,276 A | 5/1992 | Thomas et al. ............ 357/71 |
| 5,141,896 A | 8/1992 | Katoh | |
| 5,182,225 A | 1/1993 | Matthews ................... 437/58 |
| 5,217,926 A * | 6/1993 | Langley ..................... 438/699 |
| 5,241,193 A | 8/1993 | Pfiester et al. ............. 257/67 |
| 5,272,100 A | 12/1993 | Satoh ........................ 437/29 |
| 5,310,700 A * | 5/1994 | Lien et al. ................. 257/758 |
| 5,324,683 A | 6/1994 | Fitch et al. ................ 437/65 |
| 5,386,142 A | 1/1995 | Kurtz et al. ............... 257/690 |
| 5,393,709 A | 2/1995 | Lur et al. .................. 437/228 |
| 5,407,860 A | 4/1995 | Stoltz et al. ............... 437/180 |
| 5,413,962 A | 5/1995 | Lur et al. | |
| 5,426,072 A | 6/1995 | Finnila ...................... 437/208 |
| 5,444,015 A | 8/1995 | Aitken et al. ............. 437/182 |
| 5,451,804 A | 9/1995 | Lur et al. .................. 257/330 |
| 5,462,884 A | 10/1995 | Taniguchi .................. 437/39 |
| 5,488,015 A * | 1/1996 | Havemann et al. ....... 438/624 |
| 5,498,571 A * | 3/1996 | Mori et al. ................ 437/189 |
| 5,512,775 A * | 4/1996 | Cho ........................... 257/773 |
| 5,530,280 A * | 6/1996 | White ......................... 257/508 |

(List continued on next page.)

FOREIGN PATENT DOCUMENTS

| | | |
|---|---|---|
| JP | 63-179548 | 7/1988 |
| JP | 1-296641 | 11/1989 |
| JP | 5-206120 | 8/1993 |
| JP | 5-335475 | 12/1993 |

OTHER PUBLICATIONS

Wolf, "Silicon Processing for the VLSI Era—vol. 2," 1990 Ed., pp. 198.

*Primary Examiner*—Phat X. Cao
(74) *Attorney, Agent, or Firm*—Conley, Rose & Tayon, PC; Robert C. Kowert

(57) ABSTRACT

A dielectric material is provided having air gaps purposely formed within the dielectric. The dielectric is deposited, and air gaps formed, between respective interconnect lines. The geometries between interconnect lines is purposely controlled to achieve a large aspect ratio necessary to produce air gaps during CVD of the dielectric. Air gaps exist between interconnects to reduce the line-to-line capacitance, and thereby reduce the propagation delay associated with closely spaced interconnects.

13 Claims, 2 Drawing Sheets

U.S. PATENT DOCUMENTS

| | | | |
|---|---|---|---|
| 5,545,919 A | * 8/1996 | Ueda et al. | 257/641 |
| 5,559,049 A | 9/1996 | Cho | 437/44 |
| 5,559,055 A | 9/1996 | Chang et al. | 437/195 |
| 5,567,982 A | 10/1996 | Bartelink | 257/664 |
| 5,641,712 A | * 6/1997 | Grivna et al. | 438/624 |
| 5,646,067 A | 7/1997 | Gaul | 437/180 |
| 5,665,632 A | 9/1997 | Lur et al. | 438/422 |
| 5,668,398 A | * 9/1997 | Havemann et al. | 257/522 |
| 5,710,079 A | * 1/1998 | Sukharev | 438/778 |
| 5,716,861 A | 2/1998 | Moslehi | 437/40 |
| 5,736,446 A | 4/1998 | Wu | |
| 5,741,736 A | 4/1998 | Orlowski | 438/286 |
| 5,759,913 A | * 6/1998 | Fulford, Jr. et al. | 438/624 |
| 5,770,507 A | 6/1998 | Chen et al. | |
| 5,783,864 A | 7/1998 | Dawson et al. | 257/758 |
| 5,791,706 A | 8/1998 | Michael et al. | |
| 5,814,555 A | 9/1998 | Bandyopadhyay et al. | |
| 5,832,601 A | 11/1998 | Eldridge et al. | |
| 5,847,464 A | * 12/1998 | Singh et al. | 257/752 |
| 5,869,374 A | 2/1999 | Wu | |
| 5,869,379 A | 2/1999 | Gardner et al. | |
| 5,900,668 A | 5/1999 | Wollesen | |
| 5,953,626 A | 9/1999 | Hause et al. | |
| 5,959,337 A | 9/1999 | Gardner et al. | |
| 5,994,776 A | 11/1999 | Fang et al. | |
| 5,998,293 A | 12/1999 | Dawson et al. | |

* cited by examiner

DIELECTRIC HAVING AN AIR GAP FORMED BETWEEN CLOSELY SPACED INTERCONNECT LINES

BACKGROUND OF THE INVENTION

1. Field of the Invention

This invention relates to semiconductor fabrication and more particularly to a dielectric material placed between semiconductor interconnect lines such that the dielectric, when deposited, forms an air gap at a midline between the interconnect lines.

2. Description of the Relevant Art

An integrated circuit includes numerous conductors extending across the topography of a monolithic substrate. A set of interconnect lines (or conductors) which serve to electrically connect two or more components within a system is generally referred to as a "bus". A collection of voltage levels are forwarded across the conductors to allow proper operation of the components. For example, a microprocessor is connected to memories and input/output devices by certain bus structures. There are numerous types of busses which are classified according to their operation. Examples of well-known types of busses include address busses, data busses and control busses.

Conductors within a bus generally extend parallel to each other across the semiconductor topography. The conductors are isolated from each other and from underlying conductive elements by a dielectric, a suitable dielectric being, for example, silicon dioxide ("oxide"). Conductors are thereby lithography patterned across the semiconductor topography, wherein the topography comprises a substrate with a dielectric placed thereon. The topography can also include one or more layers of conductors which are sealed by an upper layer of dielectric material. Accordingly, the layers of conductors overlayed with a dielectric present a topography upon which a subsequent layer of conductors can be patterned.

Conductors are made from an electrically conductive material, a suitable material includes Al, Ti, Ta, W, Mo, polysilicon, or a combination thereof. Substrate includes any type of material which can retain dopant ions and the isolated conductivity regions brought about by those ions. Typically, substrate is a silicon-based material which receives p-type or n-type ions.

Generally speaking, interconnect lines (or conductors) are fashioned upon the topography and dielectically spaced above an underlying conductor or substrate by a dielectric of thickness $T_{d1}$. Each conductor is dialectically spaced from other conductors within the same level of conductors by a distance $T_{d2}$. Accordingly, conductor-to-substrate capacitance $C_{LS}$ is determined as follows:

$$C_{LS} = eW_L L/T_{d1} \qquad \text{(Eq. 1)}$$

Further, the conductor-to-conductor capacitance $C_{LL}$ is determined as follows:

$$C_{LL} \approx eT_c L/T_{d2} \qquad \text{(Eq. 2)}$$

where e is the permittivity of the dielectric material (the dielectric material between the conductor and substrate or the dielectric material between conductors), $W_L$ is the conductor width, $T_c$ is conductor thickness, and L is the conductor length. Resistance of the conductor is calculated as follows:

$$R = (rL)/W_L T_c \qquad \text{(Eq. 3)}$$

where r represents resistivity of the conductive material, and $T_c$ is the interconnect (conductor) thickness. Combinations of equations 1 and 3, and/or equations 2 and 3 indicate the propagation delay of a conductor as follows:

$$RC_{LS} \approx reL^2/T_c T_{d1}$$

$$RC_{LL} \approx reL^2/W_L T_{d2}$$

Propagation delay is an important characteristic of an integrated circuit since it limits the speed (frequency) at which the circuit or circuits can operate. The shorter the propagation delay, the higher the speed of the circuit or circuits. It is therefore important that propagation delay be minimized as much as possible given the geometric constraints of the semiconductor topography.

Propagation delay is shown to be a function of both line-to-substrate capacitance $C_{LS}$ as well as line-to-line capacitance $C_{LL}$. Accordingly, propagation delay is determined by parasitic capacitance values between conductors ($C_{LL}$), and parasitic capacitance values between each conductor and substrate ($C_{LS}$). As circuit density increases, spacing between conductors decrease and capacitance $C_{LL}$ becomes predominant relative to $C_{LS}$. In other words, line-to-line capacitance $C_{LL}$ increases with decreasing spacing between conductors. FIG. 1 illustrates the effect of line-to-line spacing on $C_{LL}$. As spacing decreases, $C_{LL}$ is shown to increase dramatically as compared to $C_{LS}$. Modern integrated circuits which employ narrow interconnect spacings thereby define $C_{LL}$ as the primary parasitic capacitance rather than $C_{LS}$.

Increases in $C_{LL}$ pose two major problems. First, an increase in $C_{LL}$ generally causes an increase in the time at which a transition on the one end of the conductor occurs at the other end. Increase in transition time (i.e., increase in speed degregation) thereby requires a longer drive period. If the conductor extends along a critical speed path, speed degregation on the line will jeopardize functionality of the overall circuit. Second, a larger $C_{LL}$ causes an increase in crosstalk noise. A conductor which does not transition, nonetheless receives crosstalk noise from neighboring lines which do.

It is therefore important to minimize propagation delay, especially in critical speed paths. Given the constraints of chemical compositions, it is not readily plausible to reduce the resistivity of conductor materials. Geometric constraints make it difficult to increase conductor thickness $T_c$ or dielectric thickness $T_{d1}$ or $T_{d2}$. Still further, instead of reducing length L of a conductor, most modern integrated circuits employ longer interconnect lines which compound the propagation delay problems. Accordingly, a need arises for instituting a reduction in propagation delay but within the chemical and geometric constraints of existing fabrication processes. It is therefore desirable that a fabrication process be derived which can reduce propagation delays by reducing the permittivity e of dielectric material. More specifically, the desired process must be one which reduces permittivity of dielectric material between conductors since the line-to-line capacitance appears a more predominant factor than the line-to-substrate capacitance. As such, it would be desirable to employ a fabrication technique in which dielectrics between conductors achieve low permittivity.

SUMMARY OF THE INVENTION

The problems outlined above are in large part solved by a fabrication process which produces a low permittivity dielectric between interconnect lines. The process utilizes a deposition technique which purposefully allows formation of an air gap at a midline between closely spaced interconnect lines. It is known that the permittivity of air is less than that of a semiconductor dielectric, such as oxide, oxynitride, spin on polymer, etc. Accordingly, an air gap within the dielectric causes a decrease in overall permittivity between interconnects. Reduction in permittivity results in a reduction in the line-to-line capacitance $C_{LL}$. Reduction in $C_{LL}$ is shown above to cause corresponding reduction in propagation delay $RC_{LL}$. Incorporation of an air gap thereby reduces propagation delay and proves beneficial in meeting speed requirements within critical path interconnect lines, possibly interconnect lines spaced adjacent each other within a bus structure.

Broadly speaking, the present invention contemplates a dielectric interposed between a pair of integrated circuit interconnects are. The integrated circuits interconnects arranged upon a semiconductor topography. The topography includes a silicon substrate and one or more layers of dielectric and/or levels of interconnect. The dielectric includes an area therein which is void of dielectric. The voided area is deemed an air gap removed of fluid, gaseous or solid material. If any gaseous material is within the air gap, that gaseous material constitutes an inert gas. The air gap is completely encased within the dielectric near a midline between the pair of integrated circuit interconnects. The air gap area extends a spaced distance from the semiconductor topography and between the pair of interconnects. Further, the air gap area is sealed by the dielectric which flows across the upper regions of the air gap.

The present invention further contemplates a method for forming dielectric material between integrated circuit interconnects. The method includes the steps for providing a semiconductor topography and thereafter depositing a layer of metal upon the semiconductor topography. A first dielectric is then deposited upon the layer of metal, and the first dielectric and metal layers are thereafter removed in select regions across the semiconductor topography. Select removal of the first dielectric and the metal allows formation of a spaced set of first dielectric-covered interconnects. A second dielectric material is then deposited from a silane source upon the spaced set of first dielectric-covered interconnects to form an air gap between the dielectric-covered interconnects.

The first and second dielectric materials are preferably deposited from a chemical vapor deposition chamber maintained substantially near or slightly below atmospheric pressure. In order to achieve an air gap during second dielectric deposition, the cumulative thickness of the metal and the first dielectric is maintained greater than a distance between the spaced set of first dielectric-covered interconnects. First dielectric thickness is thereby necessary to ensure an aspect ratio (i.e., spacing height versus spacing width) greater than 1.0 by ensuring the cumulative thickness of metal and first dielectric (spacing height) is greater than a distance between the spaced set of dielectric-covered interconnects. Depositing the second dielectric from an atmospheric pressure chemical vapor deposition (APCVD) chamber upon the area of controlled aspect ratio thereby allows formation of voids or air gaps in the regions of interest.

BRIEF DESCRIPTION OF THE DRAWINGS

Other objects and advantages of the invention will become apparent upon reading the following detailed description and upon reference to the accompanying drawings in which.

Figure 1:
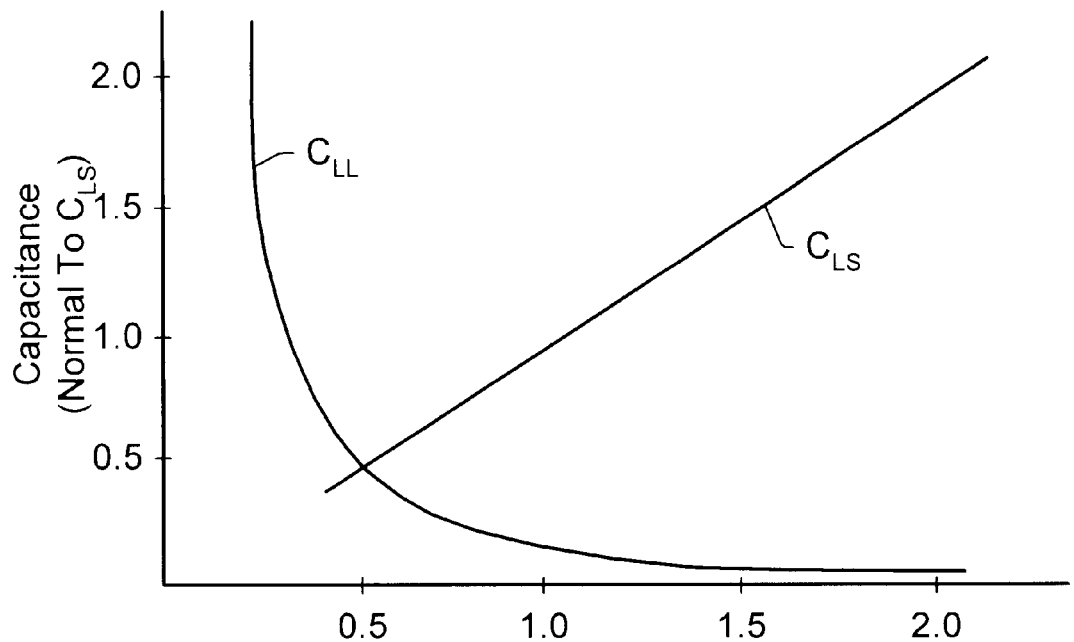
FIG. 1 is a graph of conductor-to-conductor as well as conductor-to-substrate capacitance plotted as a function of line spacing.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2:
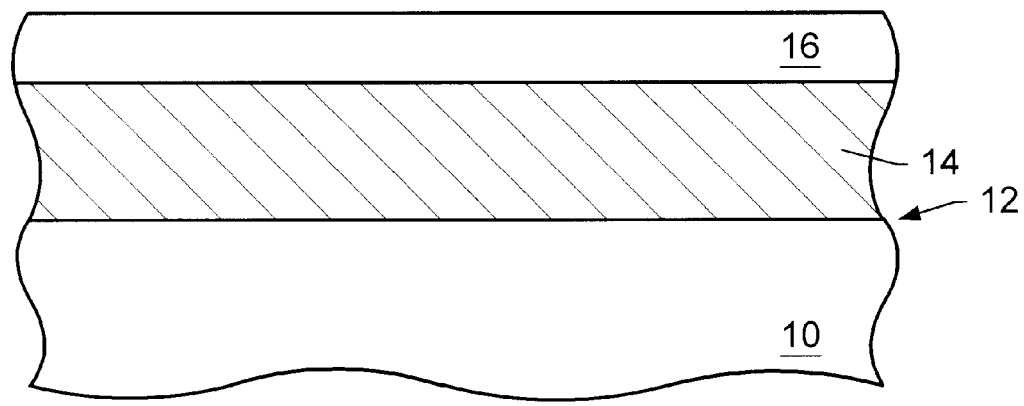
FIG. 2 is a partial cross-sectional view of an integrated circuit topography with a conductive layer and first dielectric layer deposited upon the semiconductor topography.

Turning now to the drawings, FIG. 2 illustrates, in partial cross-section, a semiconductor topography 10. Semiconductor topography 10 includes a dielectric, such as oxide, placed upon a silicon substrate or, alternatively, dielectrically isolated level or levels of interconnects placed upon a silicon substrate. Semiconductor topography 10 includes an upper surface 12 which is preferably planar and conditioned so as to receive a conductive layer 14. Conductive layer 14 includes any conductive material, such as a metal (e.g., Al, W, Ta, Ti, etc.), polysilicon, or a combination thereof. Conductive layer 14 is deposited, for example, to a thickness between 0.5 to 2.0 microns. Conductive layer 14 is preferably deposited through sputter deposition, chemical vapor deposition, or metal evaporation. Deposited upon conductive layer 14 is a first dielectric layer 16. First dielectric 16 includes any material having insulative capabilities. A suitable first dielectric 16 includes silicon dioxide ("oxide") deposited from a chemical vapor deposition chamber. As described below, the thickness at which dielectric 16 is deposited varies depending upon the spacing between dielectric-covered interconnects.

Figure 3:
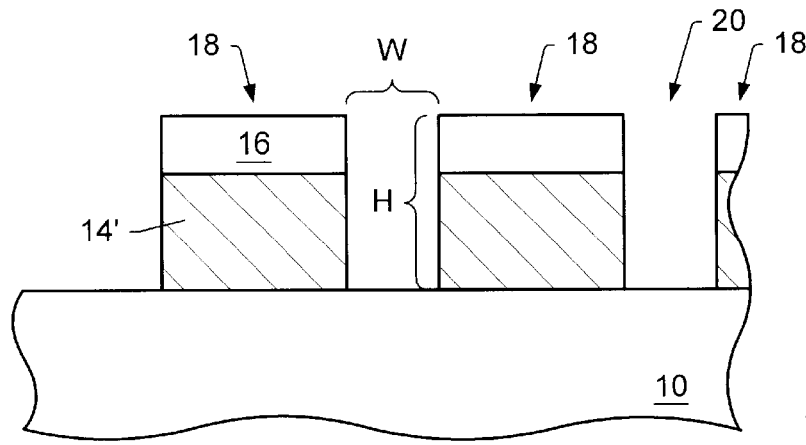
FIG. 3 is a processing step subsequent to that shown in FIG. 2, whereby select regions of first dielectric and underlying conductive layer are removed to form a plurality of spaced dielectric-covered interconnects.

Referring now to FIG. 3, a lithography procedure is used to remove first dielectric 16 and underlying conductive layer 14 in select regions across topography 10. The regions removed of layers 14 and 16 are defined as a space 20 between resulting dielectric-covered interconnects 18. Each dielectric-covered interconnect 18 comprises a patterned conductive layer 14' and an overlying, patterned first dielectric 16' in which layers 14' and 16' have substantially equal lateral widths.

The dimensions of spacing 20 between dielectric-covered interconnects 18 are brought about to achieve a unique aspect ratio. The aspect ratio is defined herein to include a height H greater than width W. Preferably, dimension H is more than twice dimension W so as to produce an aspect ratio of 2.0. The aspect ratio is controlled by varying the thickness of first dielectric 16. In most instances, thickness of conductive layer 14 is defined based upon the metal sputter process parameters. First dielectric 16 thickness, however, can be changed to produce a unique spacing 20 geometry which is conducive to the formation of air gaps, as described below.

Figure 4:
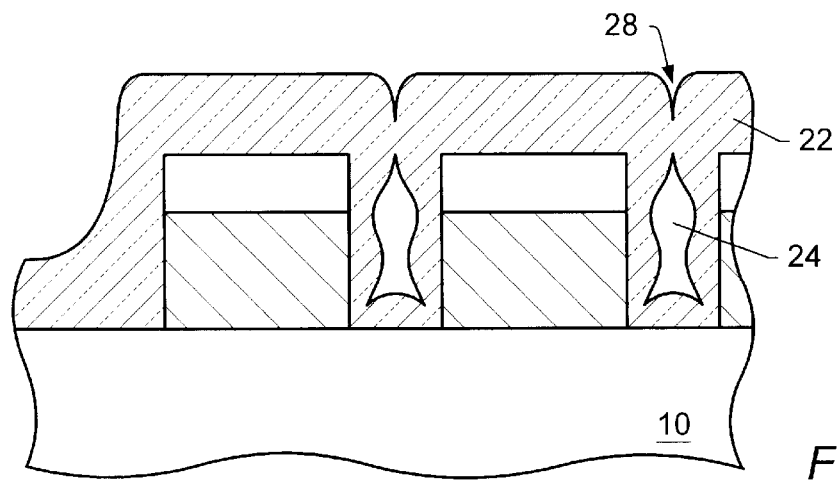
FIG. 4 is a processing step subsequent to that shown in FIG. 3, whereby a second dielectric is deposited upon and between the dielectric-covered interconnects to form an air gap between each pair of interconnects.

Referring now to FIG. 4, a second dielectric 22 is deposited across semiconductor topography 10, i.e., across and between dielectric-covered interconnects 18. Second dielectric 22 is deposited in a way which forms air gaps 24 within spacing 20 regions. Air gaps 24 are formed uniformly between closely spaced, dielectric-covered interconnects 18. More specifically, air gaps 24 are formed in spacing 20 regions which have an aspect ratio exceeding 1.0, and preferably exceeding 2.0. Air gaps 24 are formed during the deposition of second dielectric 22, from a silane source and from within an atmospheric pressure chemical vapor deposition (APCVD) apparatus. It is preferred that second dielectric 22 not be formed from a TEOS source, or from within a low pressure chemical vapor deposition (LPCVD) chamber or a plasma enhanced chemical vapor deposition (PECVD) chamber. Second dielectric 22 is preferably formed from a nitride source material such that second dielectric 22 comprises an oxynitride, or a layered composite of oxide/nitride/oxide. If second dielectric 22 comprises an oxide, the oxide can encompass phosphorus doping to enhance its cusping and void-formation effect. Accordingly, instead of trying to avoid voids or air gaps as in conventional art, the present process purposely chooses a deposition material and process which ensures second dielectric 22 produces voids or air gaps in regions having large aspect ratios.

Each air gap 24 is formed within the CVD chamber, and is thereby dimensioned completely within second dielectric 22. Air gap 24 is devoid of solid and liquid material, however, it does contain gaseous material resulting from the CVD chamber ambient. Gaseous material, such as argon, hydrogen, and/or oxygen may be entrained within the air of the air gap as a result of the air gap being formed during CVD process, given the fact that CVD does employ such gaseous material.

Figure 5:
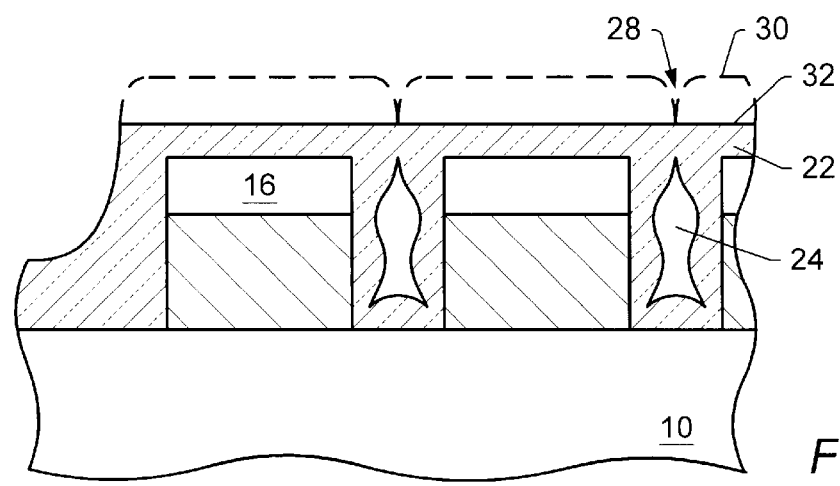
FIG. 5 is a processing step subsequent to that shown in FIG. 4, whereby the second dielectric upper surface is substantially planarized in readiness of an overlying layer of conductors.

Air gap 24 is completely encompassed within second dielectric 22 at or near the midline between dielectric-covered interconnects 18. At the upper surface of second dielectric 22 directly above air gaps 24 are recesses or indents 28. Indents 28 produce localized regions of non-planarity above closely spaced dielectric-covered interconnects 18. Indents 28 can be subsequently removed, as shown in FIG. 5, by a planarization step. FIG. 5 illustrates, in a processing step subsequent to FIG. 4, removal of indents 28 by selectively etching back initial surface 30 to final surface 32. Etch back is achieved by depositing, for example, a planarization layer with similar etch characteristics to that of second dielectric 22. The planarization layer and underlying surface 30 is then blanket etched to produce surface 32. Alternatively, final surface 32 can be achieved by chemical mechanical polish (CMP) of surface 30 to an elevational level below indents 28. The finalized surface resulting from selective etch back or CMP is shown in FIG. 5 as reference numeral 32.

It would be appreciated to those skilled in the art having a benefit of this disclosure that this invention is capable of applications with numerous types of MOS-processed circuits. Furthermore, it is to be understood that the form of the invention shown and described is to be taken as presently preferred embodiments. Various modifications and changes may be made to each and every processing step as would be obvious to the person skilled in the art having the benefit of this disclosure. Provided the spacing area is properly configured with a necessary aspect ratio, and provided the second dielectric material is deposited so as to form voids and/or cusps between closely-spaced interconnects, various deposition techniques and deposition processes can be used. Thus, the purpose hereof is to form a reentrant angle near the midline between interconnects during the cumulative deposition of dielectric material comprising the second dielectric layer. The cumulative deposition of second dielectric material presents a void or air gap defined by the reentrant angles. It is intended that the following claims be interpreted to embrace all such modifications and changes and, accordingly, the specification and drawings are to be regarded in an illustrative rather than a restrictive sense.

What is claimed is:

1. A method for forming dielectric material between integrated circuit interconnects, comprising:

providing a semiconductor topography;

depositing a layer of metal upon said semiconductor topography;

depositing a first dielectric upon said layer of metal;

removing said first dielectric and said metal in select regions across said semiconductor topography to form a spaced set of dielectric-covered interconnects, wherein said dielectric-covered interconnects comprise a metal portion underlying a dielectric portion, and wherein lateral widths of said metal and dielectric portions are substantially equal; and depositing a second dielectric material upon said spaced set of dielectric-covered interconnects to form an air gap between said dielectric-covered interconnects, wherein the air gap is formed during said depositing a second dielectric material.

2. The method as recited in claim 1, wherein said metal comprises a refractory metal.

3. The method as recited in claim 1, wherein the step of depositing a first dielectric comprises chemical vapor depositing from within a chamber maintained substantially near atmospheric pressure.

4. The method as recited in claim 1, wherein the step of depositing a second dielectric comprises chemical vapor depositing from within a chamber maintained substantially near atmospheric pressure.

5. The method as recited in claim 1, wherein the first and second dielectric each comprise nitride, oxynitride or silicon dioxide.

6. The method as recited in claim 1, wherein a thickness of said first dielectric is chosen such that a cumulative thickness of said metal and said first dielectric is greater than a distance between each member of the spaced set of dielectric-covered interconnects.

7. The method as recited in claim 1, wherein a thickness of said first dielectric is chosen such that a cumulative thickness of said metal and said first dielectric is greater than twice a distance between each member of the spaced set of dielectric-covered interconnects.

8. The method as recited in claim 1, wherein said second dielectric material is deposited from a silane source.

9. The method as recited in claim 1, wherein the second dielectric is formed from a nitride source material.

10. The method as recited in claim 1, wherein the second dielectric comprises phosphorous doping.

11. The method as recited in claim 1, further comprising planarizing the second dielectric.

12. The method as recited in claim 11, wherein said planarizing comprises:

depositing on the second dielectric a planarization layer with similar etch characteristics to that of the second dielectric; and etching the planarization layer and the second dielectric.

13. The method as recited in claim 11, wherein said planarizing comprises chemical mechanical polishing the surface of the second dielectric.

* * * * *